United States Patent [19]

Sakai et al.

[11] Patent Number: 5,284,822
[45] Date of Patent: Feb. 8, 1994

[54] OXIDE SUPERCONDUCTOR AND PROCESS FOR PRODUCING THE SAME

[75] Inventors: Takenobu Sakai, Aichi; Kozi Nishio, Kobe; Naoyuki Ogawa, Anjou; Izumi Hirabayashi, Nagoya; Shoji Tanaka, Tokyo, all of Japan

[73] Assignees: International Superconductivity Technology Center; Toyota Jidosha Kabushiki Kaisha; Kawasaki Jukogyo Kabushiki Kaisha; NGK Insulators, Ltd., all of Japan

[21] Appl. No.: 695,813

[22] Filed: May 7, 1991

[30] Foreign Application Priority Data

May 8, 1990 [JP] Japan ................................. 2-118363

[51] Int. Cl.$^5$ ............................................ H01L 39/00
[52] U.S. Cl. ........................................ 505/1; 505/785; 505/729; 428/930; 501/123; 501/152; 501/153; 501/154; 501/108; 501/127; 501/126; 501/102; 252/521
[58] Field of Search .................... 505/1, 785, 729; 428/930; 501/123, 152, 102, 126, 127, 153, 154, 108; 252/521

[56] References Cited

U.S. PATENT DOCUMENTS 3,932,315  1/1976  Sleight ................................. 252/521
4,906,609  3/1990  Yamaguchi et al. ................. 505/1

FOREIGN PATENT DOCUMENTS 10319807  6/1989  European Pat. Off. .
10374263  12/1989  European Pat. Off. .
9004856  5/1990  European Pat. Off. .
0406456A1  1/1991  European Pat. Off. .
63-239111  10/1988  Japan .
9004856  5/1990  World Int. Prop. O. .

OTHER PUBLICATIONS

Jin et al, "Processing For High Critical Currents in YBa$_2$Cu$_3$O$_{7-\delta}$", MRS Sym, Superconducting, Aug. 17, 1988.
Cheung et al, "Superconductor-Substrate Interactions of the Y-Ba-Cu Oxide", *J. Mater. Res.*, vol. 4, No. 1, Jan./Feb. 1989.
Del Angel Vincente et al., "Effect of Silicon Carbide on the Properties of the Superconductor YBa$_2$Cu$_3$O$_{7-\delta}$", Rev. Inst. Mex. Pet. 22(2), 109-12, 1990.
"Preparation of Y-Ba-Cu-O Superconductors With High Critical Current Density by Unidirectional Melt Solidificaiton", 362 Japanese Journal of Applied Physics 29 (1990) Feb., No. 2, Part 2, Tokyo, Japan.
"Variation of Composition in a Bi(Pb)-Sr-Ca-Cu-O Grain and the Influence of Mg and Ba Doping on Its Superconductivity", Japanese Japanese Journal of Applied Physics, vol.28, No. 7, Jul. 1989, pp. L 1140–L 1143.
"Improvement of Critical Current Density in YBa$_2$Cu$_3$O$_{6+x}$ Superconductor by Sn Addition", Japanese Journal of Applied Physics, vol. 29, No. 9, Sep. 1990, pp. L 1621-L 1623.
"Molten Salt, vol. 32, No. 3 Supplement (1989.9)", pp. 272–284, J. Mater. Res., vol. 4, No. 1, Jan./Feb. 1989, pp. 1-15.

*Primary Examiner*—Mark L. Bell
*Assistant Examiner*—C. M. Bonner
*Attorney, Agent, or Firm*—Finnegan, Henderson, Farabow, Garrett & Dunner

[57] ABSTRACT

Disclosed are an oxide superconductor, and an optimum process for producing the same. The oxide superconductor comprises a base material phase including an oxide superconducting material, the oxide superconducting material including barium (Ba) at least and being free from grain boundaries, and precipitation phases contained in an amount of 1 to 50% by volume in the base material phase and dotted therein in a manner like islands, the precipitation phases being oxides of a metal selected from the group consisting of silicon (Si), aluminum (Al), zirconium (Zr), magnesium (Mg), titanium (Ti), strontium (Sr), tungsten (W), cobalt (Co) and vanadium (V), and being products of decomposition reaction of the base material phase. In the production process, the constituent materials are treated thermally at a partially melting temperature in order to give the above-described novel structure to the oxide superconductor. Thus, the precipitation phases are dotted in a manner like islands in a sea of the base material phase being free from the grain boundaries, and the precipitation phases work as the pinning centers. Therefore, the oxide superconductor exhibits a high "Jc" value.

14 Claims, 3 Drawing Sheets

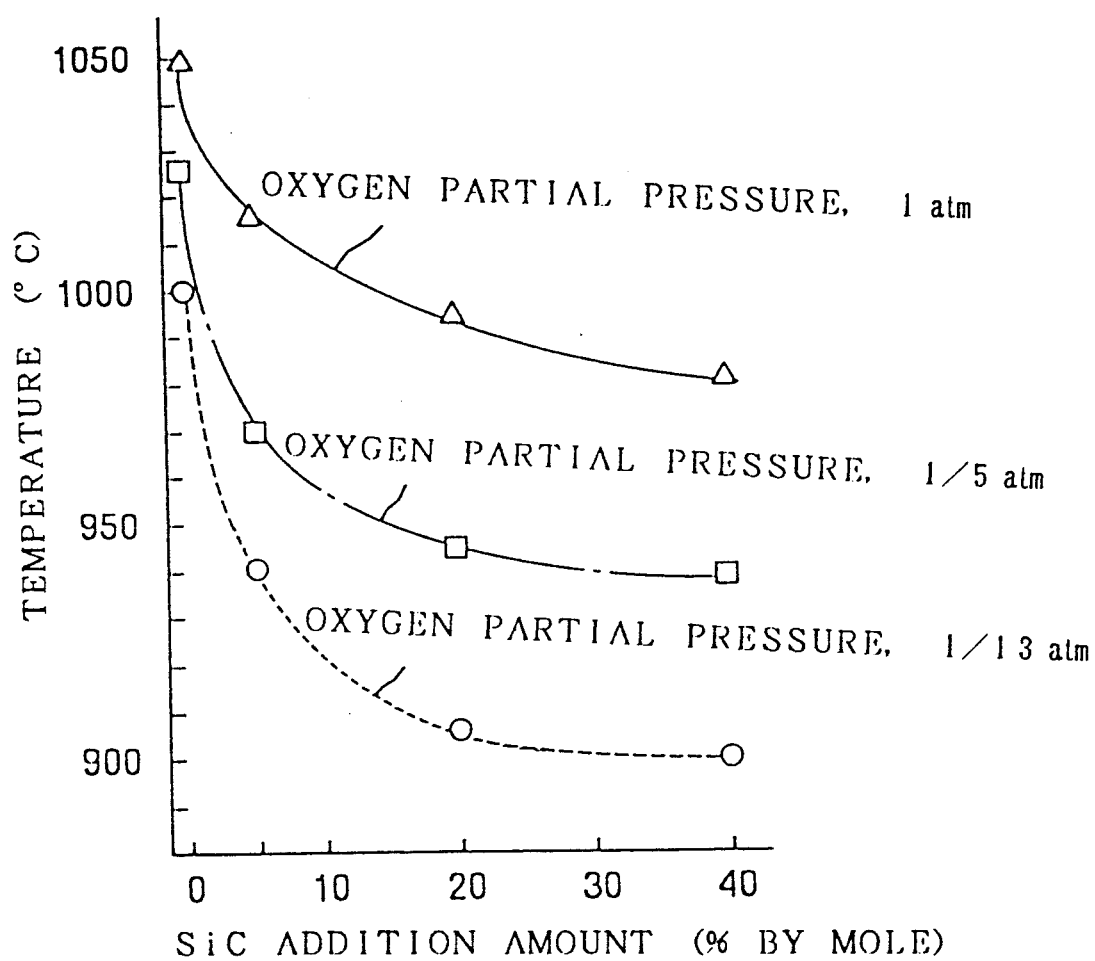

OXIDE SUPERCONDUCTOR AND PROCESS FOR PRODUCING THE SAME

BACKGROUND OF THE INVENTION

1. Field of the Invention

The present invention relates to an oxide superconductor including barium (Ba) at least, and to a process for producing it. The oxide superconductor prepared by the present invention has a high critical current density, and is an extremely useful material for a superconducting wire, a superconducting tape and other applications.

2. Description of Related Art

In 1986, it was discovered that La-Ba-Cu-O oxide exhibited a sharply dropped electric resistance at around 30K. Since the discovery, the research and development on oxide superconductors have been carried out very actively. At present, Y-Ba-Cu-O oxide is known as a high temperature superconductor which has high critical temperature of around 90K, and it is investigated for many applications.

When making a superconducting magnet, it is required to make the superconductor into a wire or a tape. Accordingly, the superconductor has been first filled in a sheath comprising copper (Cu), silver (Ag) or the like. Then, the sheath filled with the superconductor is swaged and rolled, and thereafter it is heat treated.

Despite its name, a superconductor, it is impossible to flow a current over a certain critical value. The critical value is critical current density (hereinafter abbreviated to "Jc"). The "Jc" plays the most important role for characterizing the superconductor for an actual applications. However, other than superconductors formed in thin films, no "Jc" at a practical level value has not been attained so far. Therefore, an improved "Jc" value has been longed for a superconductor formed in a wire or a tape.

The presence of the grain boundaries and the magnetic flux pinning force has been known as causes which influence the "Jc" value greatly. Namely, it has been known that the presence of the grain boundaries causes to decrease the "Jc" value in polycrystalline sintered bodies. Further, it has been also known that precipitated particles work as pinning centers and improve the "Jc" value.

Accordingly, there has been proposed recently a production process, which relates to a melting method or the like, as set forth in an extra issue of a magazine, "Yoyu-En (Molten Salt)" Vol. 32, No. 3. The production process eliminates the grain boundaries from a Y-Ba-Cu-O oxide, and disperses the precipitates produced by melting and decomposing in the Y-Ba-Cu-O oxide. Since the Y-Ba-Cu-O oxide has no grain boundaries, and since the precipitates produced by melting and decomposing work as the pinning centers of magnetic flux, a high "Jc" value can be obtained by the production process.

According to the production process, i.e., a melting method as described above, an oxide powder is first heated at a high temperature, and thereafter the molten oxide is cooled rapidly so as to decompose the compositions. Then, precipitation phases to be the pinning centers and superconductor phases having no grain boundaries are generated by re-heating and slow cooling. In the production process, however, it is hard to control precisely the conditions during the rapid cooling, and it is also hard to control precisely the amount, grain size, distribution and the like of the precipitates produced by melting and decomposing. In addition, the product must be treated further under a grading temperature condition in order to obtain an oriented structure. Thus, the production process results in an increasing man-hour requirement.

Further, when producing a superconductor wire with a silver sheath, a thermal treatment is required at a temperature of the melting point of silver (i.e., 960° C.) or less. However, in the case of $YBa_2Cu_3O_{7-x}$, the grain boundaries are generated when it is heated and sintered at around 960° C., and no high "Jc" value can be obtained accordingly. On the other hand, when a copper sheath is used, the heating and sintering temperature can be raised to 1000° C. securely. However, since oxygen does not permeate through the copper sheath, and since copper takes oxygens from the oxides disposed in the copper sheath, there occurs an oxygen insufficiency in the copper sheath. Therefore, the copper or copper alloy sheath has not been used recently, and the expensive silver sheath is inevitably used at present. Thus, a degree of freedom is very limited in the selection of an oxide superconductor.

SUMMARY OF THE INVENTION

The present invention has been developed in view of the circumstances described above. It is therefore an object of the present invention to improve the "Jc" value of an oxide superconductor and to make the "Jc" value controllable precisely. It is another object of the present invention to increase the degree of freedom in the selection of the raw materials for an oxide superconductor and to make even the copper sheath applicable to the raw materials.

An oxide superconductor according to the present invention comprises:

a base material phase including an oxide superconducting material, the oxide superconducting material including barium (Ba) at least and being free from grain boundaries; and precipitation phases contained in an amount of 1 to 50% by volume in the base material phase and dotted therein in a manner like islands, the precipitation phases being oxides of a metal selected from the group consisting of silicon (si), aluminum (Al), zirconium (Zr), magnesium (Mg), titanium (Ti), strontium (Sr), tungsten (W), cobalt (Co) and vanadium (V), and being products of decomposition reaction of the base material phase.

The oxide superconducting material constituting the base material phase includes barium (Ba) element at least. The oxide superconducting material may be an oxide superconducting material expressed in a composition formula, $LnBa_2Cu_3O_{7-\delta}$ in which "Ln" stands for yttrium (Y) and lanthanides elements, an oxide superconducting material expressed in a composition formula, $YBa_2Cu_4O_{10-\delta}$, an oxide superconducting material expressed in a composition formula, an oxide superconducting material expressed in a composition formula, $BaPb_{1-x}Bi_xO_3$ ($0 \leq x \leq 0.35$) or the like. In particular, since the $YBa_2Cu_3O_{7-\delta}$ has a high critical temperature and is less toxic, it is especially preferred to use the $YBa_2Cu_3O_{7-\delta}$.

The base material phase is free from grain boundaries, and contains the precipitation phases dotted therein in a manner like islands. The precipitation phases includes oxides of at least one metal which is selected from the group consisting of silicon (Si), aluminum (Al), zirconium (Zr), magnesium (Mg), titanium (Ti), strontium (Sr), tungsten (W), cobalt (Co) and vanadium (V), and it also includes products of decomposition reaction of the base material phase. Since the precipitation phases work as the pinning centers, and since no grain boundary is present in the base material phase, it is possible to obtain an oxide superconductor having a high "Jc" value. Further, the precipitation phases are present in the amount of 1 to 50% by volume with respect to the entire base material phase. When the precipitation phases are present in an amount of less than 1% by volume, the pinning force decreases and a high "Jc" value cannot be obtained. When the precipitation phases are present in an amount of more than 50% by volume, the base material phase diminishes relatively and the superconductive characteristic comes to deteriorate. Furthermore, it is preferred to micro-fine and produce a large number of the precipitation phases whose grain sizes fall in a range of 0.01 to 100 micrometers approximately.

An optimum process for producing the oxide superconductor having the structure described above, i.e., a production process according to the present invention, comprises the steps of:

(1) mixing step of mixing an additive powder including at least one of a metallic oxide powder and a compound powder in an amount of 1 to 50% by mole with respect to a base material powder including an oxide superconducting material, thereby obtaining a mixed powder, the metallic oxide powder including a metal selected from the group consisting of silicon (Si), aluminum (Al), zirconium (Zr), magnesium (Mg), titanium (Ti), strontium (Sr), tungsten (W), cobalt (Co) and vanadium (V), the compound powder made into oxides of the metal by oxidation, and the oxide superconducting material including barium (Ba) at least:

(2) molding step of molding the mixed powder into a molded body having a predetermined shape; and (3) sintering step of heating and sintering the molded body at a partially melting temperature or more at which at least part of the mixed powder melts.

As for the base material powder, a powder of an oxide superconducting material constituting the above-described base material phase is used. In the mixing step, an additive powder including at least one of a metallic oxide powder, the metallic oxide including at least one of the metal, and a compound powder is mixed with the base material powder. The metal is at least one selected from the group consisting of silicon (Si), aluminum (Al), zirconium (Zr), magnesium (Mg), titanium (Ti), strontium (Sr), tungsten (W), cobalt (Co) and vanadium (V). The compound powder is the one which is oxidized to oxides of the metal selected from the group consisting of silicon (Si), aluminum (Al), zirconium (Zr), magnesium (Mg), titanium (Ti), strontium (Sr), tungsten (W), cobalt (Co) and vanadium (V). Here, the compound powder oxidized to the oxides means a powder of simple substances of the metals, carbides of the metals, nitrides of the metals, hydroxides of the metals or the like. In addition, the compound powder may be a composite compound, such as $ZrSiO_4$, $SrTiO_3$ or the like, including the metals selected from the group described above. The average particle diameters of the powders are not limited particularly. However, it is preferred that the base material powder has an average particle diameter falling in a range of 0.1 to 100 micrometers, and that it has an average diameter at around 10 micrometers approximately. As for the additive powder, it is preferred that the additive powder has an average particle diameter falling in a range of 0.1 to 100 micrometers, and that it has an average diameter at around 1 micrometer approximately.

In the mixing step, these powders are mixed uniformly. As for a mixing method, it is possible to use any known mixing method such as mixing with a ball mill or the like. Further, the additive powder is compounded in the amount of 1 to 50% by mole with respect to the base material powder. When the compounded amount is less than 1% by mole, the precipitation phases are produced in a lesser amount. Accordingly, the "Jc" value does not improve. When the compounded amount is more than 50% by mole, the base material phase diminishes relatively. Accordingly, the superconductive characteristic comes to deteriorate.

In the molding step, the mixed powder is molded into a predetermined shape. As for a molding method, it is also possible to use any known molding method.

One of the major features of the production process according to the present invention lies in the sintering step. In the sintering step, the molded body is heated and sintered at the partially melting temperature or more at which at least part of the mixed powder melts. When the inventors of the present invention heated a mixed powder which was an oxide superconducting material with the above-described additive powder added, the inventors found that the mixed powder exhibited a decreased melting point compared with that of the simple substance of the oxide superconductor. After investigating the mixed powder treated at around the melting point in detail, the inventors discovered that the grain boundaries disappeared in the base material phase, and that the micro-fined precipitation phases were generated in a large number when the mixed powder was treated at the partially melting temperature or more at which at least part of the mixed powder melts. In this way, the inventors have completed the present invention.

Here, the partially melting temperature means a temperature at which part of the mixed powder melts, at which part of the base material powder decomposes and produces decomposition products resulting from the reaction of part of the decomposed base material powder and the additive powder, and at which the grain boundaries disappear in the base material phase. The partially melting temperature depends on a speed of a temperature increment, a composition of the mixed powder or the like, but it falls in a comparatively limited range around a temperature immediately before the melting point. When the sintering is carried out at a temperature lower than the partially melting temperature, the grain boundaries remain. Accordingly, no improvement on the "Jc" value can be expected. When the sintering is carried out at a temperature higher than the partially melting temperature, almost all of the mixed powder melts. Accordingly, there arises different compositions in the product in the vertical direction because of specific gravity differences, and there also arises voids because of the generation of decomposition gases. Thus, such a sintering is not preferable. Therefore, it is preferred that the heating and sintering are carried out in a range of from the partially melting temperature to the melting point of the mixed powder, and it is further preferred that the heating and sintering are carried out at the partially melting temperature, though the partially melting temperature falls in a very limited range.

By applying the production process according to the present invention, a wire or the like including an oxide superconductor can be produced with ease. Since the melting point of the mixed powder decreases compared with that of the simple substance of the oxide superconductor, the degree of freedom increases in the selection of the raw materials when producing a wire or a tape with a silver sheath.

When producing a wire or a tape with a copper sheath, the production process according to the present invention offers a unique and advantageous effect. In this case, the production process of an oxide superconductor member according to the present invention comprises the steps of:

(1) mixing step of mixing a metallic oxide powder including a metal selected from the group consisting of silicon (Si), aluminum (Al), zirconium (Zr), magnesium (Mg), titanium (Ti), strontium (Sr), tungsten (W), cobalt (Co) and vanadium (V) in an amount of 1 to 50% by mole with respect to a base material powder including an oxide superconducting material, the oxide superconducting material including barium (Ba) at least, thereby obtaining a mixed powder; and (2) heat treatment step of filling the mixed powder in a copper sheath, drawing or rolling said copper sheath filled up with the mixed powder, and thereafter heat-treating the copper sheath filled up with the mixed powder at a partially melting temperature or more at which at least part of the mixed powder melts.

In this aspect of the present invention, the oxide superconductor member is either a wire or a tape. First, the metallic oxide powder is compounded into the base material powder. Contrary to the above-described aspect of the production process according to the present invention, no compound powder which is oxidized to the metallic oxide is employed herein. Then, the mixed powder is filled in the copper sheath, and the copper sheath is drawn or rolled into a wire or a tape. Finally, the copper sheath is treated at a partially melting temperature or more, preferably at a partially melting temperature, in a manner similar to the above-described aspect of the production process according to the present invention. Thus, the mixed powder melts and decomposes partially in the copper sheath, thereby forming an oxide superconductor. The oxide superconductor comprises a base material phase being free from grain boundaries and precipitation phases dotted in the base material phase in a manner like islands.

As described above, there is adverse effects that oxygen does not permeate through the copper sheath, and that copper takes oxygens from the oxides disposed in the copper sheath. However, in this aspect of the present invention, since the metallic oxide powder is mixed with the base material powder, and since the mixed powder is used, the metallic oxide powder supplies oxygen to the base material powder (i.e., the oxide superconducting material) and the copper sheath during the heat treatment step. Therefore, the oxygen is inhibited from being insufficient in the copper sheath, and accordingly a high quality oxide superconductor can be produced stably.

According to the process of the present invention for producing the oxide superconductor, the molded body made of the mixed powder including the base material powder and the additive powder is sintered at the partially melting temperature or more. At least parts of the base material powder and the additive powder melt and liquefies, the base material decomposes in the liquid phase, products of the decomposition reaction precipitate, and accordingly the grain boundaries disappear from the base material phase. Since these reactions are carried out in the liquid phase which is formed by the partial melting at least, the diffusion speeds of the constituents are so high that the reactions are carried out uniformly as a whole. Since the precipitation phases are dotted in a manner like islands in a sea of the base material phase being free from the grain boundaries, since there is no grain boundary, and since the precipitation phases work as the pinning centers, the oxide superconductor member thus obtained exhibits a high "Jc" value.

Further, the amounts, grain sizes, distributions and the like of the precipitation phases can be controlled precisely as one desires by varying the average particle diameters and addition amounts of the powders, the conditions during the heat treatment or the like, and accordingly the oxide superconductor can be produced to have stable performances. When the heat treatment is carried out under a temperature gradient condition, an oriented structure can be obtained simultaneously. As a result, the "Jc" value is improved further.

Furthermore, since the metallic oxide is employed as the additive powder, oxygen can be self-supplied within a sheath. Accordingly, a less expensive copper sheath can be employed as one of the raw materials. As a result, it is possible to reduce the production cost of the oxide superconductor member.

Moreover, since the sintering temperature is lowered when compared with that of the conventional production processes, the degree of freedom is increased in the selection of the raw materials for the oxide superconducting material, even when a silver sheath is employed.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure:

FIG. 4 shows relationships between silicon carbide (SiC) addition amounts and melting temperatures.

DETAILED DESCRIPTION OF THE PREFERRED EMBODIMENTS

Having generally described the present invention, a further understanding can be obtained by reference to the specific preferred embodiments which are provided herein for purposes of illustration only and are not intended to limit the scope of the appended claims.

Preliminary Experiment

A silicon carbide (SiC) powder having an average particle diameter of 0.3 micrometers was added in amounts of 0 to 60% by mole with respect to a $YBa_2Cu_3O_7$ powder having an average particle diameter of 10 micrometers. The powders were mixed with a wet type ball mill employing ethanol for 24 hours, and dried thereafter. Thus, a plurality of mixed powders was obtained. The mixed powders were weighed out in an amount of 80 mg, and their melting points were measured by the differential thermal analysis (hereinafter referred to as "DTA") under the following conditions. Namely, a flow of a mixture gas including oxygen and nitrogen was 200 ml/min., and a speed of temperature increment was 1° C./min. Further, the DTA was carried out while varying the flow of oxygen gas in three stages, i.e., at oxygen partial pressures of 1/13 atm, 1/5 atm and 1 atm. FIG. 4 illustrates how the melting points varied.

As can be seen from FIG. 4, the melting point of the mixed powder decreased by 10° to 40° C. as the SiC addition amount increased. Further, the smaller the oxygen partial pressure was set, the lower the melting point decreased. However, the influence of the SiC addition amount was equal in the three oxygen partial pressures. For instance, under the oxygen partial pressure of 1 atm, the melting point decreased from about 1050° C. to a little bit over 980° C. when the SIC powder was added in an amount of 40% by mole.

In addition, a similar preliminary experiment was carried out by using a silicon oxide ($SiO_2$) powder instead of the SiC powder. According to the extra experiment, results were observed which were similar to the SiC addition effect other than that no exothermic peak (at 400° C. approximately) was appeared in the DTA curves. The exothermic peak resulted from the oxidation of SiC.

First Preferred Embodiment

Figure 1:
FIG. 1 shows a crystalline structure of an oxide superconductor of a First Preferred Embodiment according to the present invention.

In accordance with the results of the above-described preliminary experiment, a mixed powder with the SiC powder added in an amount of 40% by mole was molded into pellets under a molding pressure of 2 ton/cm$^2$. The pellets had a diameter of 15 mm and a length of 1 mm. Then, the pellets were sintered at 980° C. for 10 hours under the oxygen flow of 1500 ml/min., thereby making the pellets into an oxide superconductor of a First Preferred Embodiment. FIG. 1 is an optical micrograph (magnification × 300) showing a crystalline structure of the thus obtained oxide superconductor.

As can be seen from FIG. 1, the oxide superconductor of the First Preferred Embodiment comprised base material phases (whitish portions in the micrograph) being free from the grain boundaries, and precipitation phases (blackish portions in the micrograph) dotted in a manner like islands in the seas of the base material phases. The precipitation phases were contained in an amount of 40% by volume with respect to the base material phase.

Further, the oxide superconductor of the First Preferred Embodiment was subjected to the electron probe microanalysis (EPMA) and the powder X-ray diffraction analysis. According to the analyses, $Y_2BaCuO_5$, $YBa_2SiO_4$ and $CuO$ were present in the precipitation phases, $Y_2BaCuO_5$ was surrounded by $YBa_2SiO_4$ and $CuO$, and the grain sizes of the precipitation phases were 0.5 to 10 micrometers. The base material phases were $YBa_2Cu_3O_7$.

Furthermore, a critical temperature "Tc" and "Jc" values of the oxide superconductor were measured by the four-probe method of the resistivity measurement. The "Jc" values were the ones at a magnetic flux density of 0 T (tesla) and a temperature of 77K and at a magnetic flux density of 1 T and a temperature of 77K, respectively. The results of the measurement are set forth in Table 1.

Comparative Example No. 1

An oxide superconductor of Comparative Example No. 1 was produced in the same manner as the First Preferred Embodiment other than that the sintering was carried out at 950° C. for 10 hours. The thus obtained oxide superconductor of Comparative Example No. 1 was subjected to the measurement in order to examine the "Tc" and "Jc" values similarly. The results of the measurement are also set forth in Table 1. Likewise, FIG. 2 is an optical micrograph (magnification × 300) showing a crystalline structure of the thus obtained oxide superconductor of Comparative Example No. 1.

Figure 2:
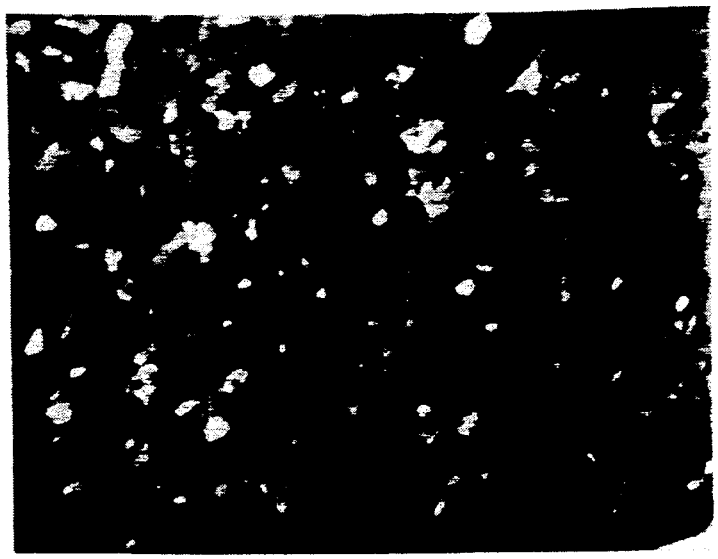
FIG. 2 shows a crystalline structure of an oxide superconductor of Comparative Example No. 1.
Figure 3:
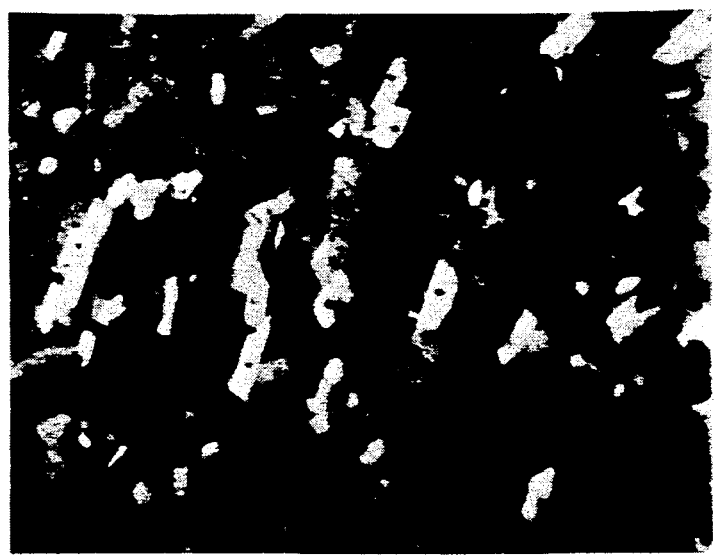
FIG. 3 shows a crystalline structure of an oxide superconductor of Comparative Example No. 2.

As can be seen from FIG. 2, in the oxide superconductor of Comparative Example No. 1, the grain boundaries existed in the base material phases (whitish particles in the micrograph), and the grain sizes of the base material phases are substantially equal to those of Comparative Example No. 2 (i.e., a conventional oxide superconductor shown in FIG. 3). Further, $SiO_2$ particles (blackish particles in the micrograph) were scattered between the base material phases.

Comparative Example No. 2

An oxide superconductor of Comparative Example No. 2 was produced in the same manner as the First Preferred Embodiment other than that no SiC powder was used and a simple powder including $YBa_2Cu_3O_7$ only was used. The thus obtained oxide superconductor of Comparative Example No. 2 was subjected to the measurement in order to examine the "Tc" and "Jc" values similarly. The results of the measurement are also set forth in Table 1. Likewise, FIG. 3 is an optical micrograph (magnification × 300) showing a crystalline structure of the thus obtained oxide superconductor of Comparative Example No. 2. As can be seen from FIG. 3, in the oxide superconductor of Comparative Example No. 2, the state of the crystalline structure looked like that of Comparative Example No. 1 substantially.

Comparative Example No. 3

An oxide superconductor of Comparative Example No. 3 was produced in the same manner as the First Preferred Embodiment other than that no SiC powder was used and a simple powder including $YBa_2Cu_3O_7$ only was used, and that the simple powder was sintered at 950° C. for 10 hours. The thus obtained oxide superconductor of Comparative Example No. 3 was subjected to the measurement in order to examine the "Tc" and "Jc" values similarly. The results of the measurement are also set forth in Table 1.

TABLE 1

|  | 1st Pref. Embodiment | Comp. Ex. No. 1 | Comp. Ex. No. 2 | Comp. Ex. No. 3 |
| --- | --- | --- | --- | --- |
| Raw Material Powder | $YBa_2Cu_3O_7$ & SiC | | $YBa_2Cu_3O_7$, Simple Substance | |
| Processing Temp. | 980° C. | 950° C. | 980° C. | 950° C. |
| Processing Time | 10 hrs. | 10 hrs. | 10 hrs. | 10 hrs. |
| "Tc" (K) | 89 | 60 | 90 | 92 |
| "Jc" (A/cm$^2$) at 0 T & 77 K | 6,300 | 200 | 400 | 300 |
| "Jc" (A/cm$^2$) at 1 T & 77 K | 2,500 | 50 | 60 | 50 |

Evaluation

It is apparent from Table 1 that the oxide superconductor of the First Preferred Embodiment processed at 980° C. showed the "Tc" value, which hardly deteriorated, and the remarkably improved "Jc" values. On the other hand, the oxide superconductor of Comparative Example No. 1 processed at 950° C. showed the sharply deteriorated "Tc." The phenomenon is similar to the results of the research described in Journal of Material Research, Vol. 14, No. 1, '89 in which the reactions of YBaCuO with substrate materials are investigated. It is apparent from the comparison between Comparative Example No. 2 and Comparative Example No. 3 that no big change was appreciable when no SiC was added in spite of the sintering temperature variation from 980° C. to 950° C. However, when comparing the First Preferred Embodiment with Comparative Example No. 1, they came to show the "Jc" values disagreeing from each other remarkably by varying the sintering temperature. Therefore, it is apparent that the "Jc" value improves considerably when the both of the conditions, i.e., the SiC addition and the sintering temperature, are satisfied.

According to the micrographs shown in FIGS. 1 through 3, in the oxide superconductor of the First Preferred Embodiment, the base material phases were free from the grain boundaries and the precipitation phases were distributed uniformly. In the oxide superconductor of Comparative Example No. 1, the base material phases had the grain boundaries remaining therein and the crystalline structure was similar to that of Comparative Example No. 2. Therefore, the high "Jc" values of the First Preferred Embodiment is believed to result from the fact that there were no grain boundaries in the base material phases and that there existed uniform precipitation phases.

In addition, an extra oxide superconductor was produced under the same conditions as those of the First Preferred Embodiment except that the sintering time was shortened to 2 hours. In the extra oxide superconductor, the average grain sizes of the precipitation phases were 0.5 micrometers approximately, and the precipitation phases did not grow when they were compared with those of the First Preferred Embodiment. Therefore, in the sintering of the mixed powder of the First Preferred Embodiment which was carried at 980° C., it is believed that the following reaction occurred to decompose part of the base material phases, and that the grain growth took place accordingly.

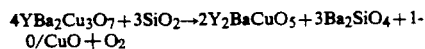

$$4YBa_2Cu_3O_7 + 3SiO_2 \rightarrow 2Y_2BaCuO_5 + 3Ba_2SiO_4 + 10/CuO + O_2$$

Second Preferred Embodiment

A mixed powder identical to that of the First Preferred Embodiment was employed, and molded into a tape-shaped molded body having a length of 30 mm, a width of 5 mm and a thickness of 1 mm. After heating the molded body to 980° C., a heat treatment was carried out under the following conditions: i.e., under a temperature gradient of 5° C./cm and at a specimen transferring speed of 0.01 mm/sec., until the temperature of the molded body became 850° C. Thereafter, the temperature of the molded body was decreased to room temperature at a speed of 100° C./hour. Here, the above-described processing was carried out in an atmosphere in which oxygen was flowed at a flow of 1500 ml/min.

In an oxide superconductor of the Second Preferred Embodiment thus obtained, the base material phases were oriented in a longitudinal direction, and the precipitation phases including $Y_2BaCuO_5$, $Ba_2SiO_4$ and CuO are dispersed uniformly in the base material phases in an amount of 40% by volume. The thus obtained oxide superconductor exhibited a "Tc" value of 90K and a "Jc" value of 17000 A/cm² at 0 T and 77K. The "Jc" value was higher than that of the First Preferred Embodiment.

Third Preferred Embodiment

An oxide superconductor of a Third Preferred Embodiment was obtained in the same manner as the First Preferred Embodiment other than the following conditions: i.e., A mixed powder was employed in which an $Al_2O_3$ powder having an average particle diameter of 0.4 micrometers was added in an addition amount of 20% by mole instead of the SiC powder, and the pellets were sintered at 970° C. for 5 hours under an oxygen flow of 1500 ml/min. The thus obtained oxide superconductor of the Third Preferred Embodiment had the base material phases being free from the grain boundaries and the precipitation phases formed in an amount of 30% by volume, and it exhibited a "Tc" value of 88K and a "Jc" value of 5000 A/cm² at 0 T and 77K.

Fourth Preferred Embodiment

An oxide superconductor of a fourth Preferred Embodiment was obtained in the same manner as the First Preferred Embodiment other than the following conditions: i.e., A mixed powder was employed in which a $ZrO_2$ powder having an average particle diameter of 0.3 micrometers was added in an addition amount of 15% by mole instead of the SiC powder, and the pellets were sintered at 1010° C. for 5 hours under an oxygen flow of 1500 ml/min. The thus obtained oxide superconductor of the Fourth Preferred Embodiment had the base material phases being free from the grain boundaries and the precipitation phases formed in an amount of 20% by volume, and it exhibited a "Tc" value of 90K and a "Jc" value of 6000 A/cm² at 0 T and 77K.

Fifth Preferred Embodiment

A mixed powder was filled in a sheath made of copper. The mixed powder included an $SiO_2$ powder in an amount of 30% by mole instead of the SiC powder used in the First Preferred Embodiment, and the sheath had an outer diameter of 6 mm, an inner diameter of 4 mm and a length of 30 mm. The sheath filled with the mixed powder was pressed by rolling in order to obtain a tape having a thickness of 0.1 mm and a width of 7 mm. The tape was treated thermally at 980° C. for 2 hours in order to obtain a tape-shaped oxide superconductor member of the Fifth Preferred Embodiment.

The thus obtained tape-shaped oxide superconductor member exhibited a favorable superconductive characteristic. Namely, it exhibited a "Tc" value of 90K and a "Jc" value of 1000 A/cm² at 0 T and 77K. The favorable superconductive characteristic is believed to result from the fact that the $SiO_2$ supplied oxygen to the base material powder in the copper sheath during the heat treatment, and that there existed a sufficient amount of oxygen enough to maintain the super conductive characteristic even when the copper sheath took away some of the oxygen. Therefore, it is possible to use a copper sheath, and accordingly to produce an oxide superconductor member which effects an advantage in view of the production cost.

Having now fully described the present invention, it will be apparent to one of ordinary skill in the art that many changes and modifications can be made thereto without departing from the spirit or scope of the present invention as set forth herein including the appended claims.

What is claimed is:

1. An oxide superconductor comprising:
   a melt textured base material phase formed of a barium-containing oxide superconducting material; and
   precipitation phases dispersed in said base material phase, said precipitation phases being present in an amount of from 1 to 50% by volume of said base material phase, and which are decomposition-products of a decomposition reaction of said superconducting material, and which are reaction-products of a reaction between said decomposition-products and oxides of one or more metals selected from the group consisting of silicon, aluminum, zirconium, magnesium, titanium, tungsten, cobalt and vanadium.

2. The oxide superconductor according to claim 1, wherein said superconducting material is selected from the group consisting of $LnBa_2Cu_3O_{7-\delta}$, wherein "Ln" stands for yttrium and lanthanides elements, $YBa_2Cu_4O_{10-\delta}$, $Tl_xBa_2Ca_yCu_zO_{w-\delta}$ ($1 \leq x \leq 2$, $0 \leq y < 3$, $1 \leq z \leq 4$, and $w = x+y+z+3$), $BaPb_{1-x}Bi_xO_3$ ($0 \leq x \leq 0.35$), and mixtures thereof.

3. The oxide superconductor according to claim 2, wherein said oxide superconducting material is $YBa_2Cu_3O_{7-\delta}$.

4. The oxide superconductor according to claim 1, wherein said precipitation phases have grain sizes falling in a range of 0.01 to 100 micrometers.

5. A process for producing an oxide superconductor member comprising:
   mixing a powdered barium-containing oxide superconducting material with from 1-50 mole %, based upon the amount of said superconducting material, of a powder of a metal oxide or a metal compound which can be oxidized to form a metal oxide, the metal being one or more metals selected from the group consisting of silicon, aluminum, zirconium, magnesium, titanium, strontium, tungsten, cobalt, vanadium and mixtures thereof, so as to form a mixed powder;
   placing said mixed powder in a copper sheath;
   drawing or rolling said copper sheath containing said mixed powder;
   and heat-treating said copper sheath containing said mixed powder at a temperature at which at least part of said mixed powder melts.

6. The process for producing an oxide superconductor member according to claim 5, wherein said oxide superconducting material is selected from the group consisting of $LnBa_2Cu_3O_{7-\delta}$ wherein "Ln" stands for yttrium and lanthanides elements, $YBa_2Cu_4O_{10-\delta}$, $Tl_xBa_2Ca_yCu_zO_{w-\delta}$ ($1 \leq x \leq 2$, $0 \leq y < 3$, $1 \leq z \leq 4$, and $w = x+y+z+3$), $BaPb_{1-x}Bi_xO_3$ ($0 \leq x \leq 0.35$), and mixtures thereof.

7. The process for producing an oxide superconductor member according to claim 6, wherein said oxide superconducting material is $YBa_2Cu_3O_{7-\delta}$.

8. The process for producing an oxide superconductor member according to claim 5, wherein said powdered barium-containing oxide superconducting material has an average particle diameter falling in a range of 0.1 to 100 micrometers.

9. The process for producing an oxide superconductor member according to claim 5, wherein said powder of a metal oxide or metal compound has an average particle diameter falling in a range of 0.1 to 100 micrometers.

10. The process for producing an oxide superconductor member according to claim 5, further including a cooling step carried out after said heat-treating under a temperature gradient, thereby obtaining said oxide superconductor member having an oriented structure.

11. A process for producing an oxide superconductor member according to claim 5, wherein said melt processing step is carried out at a temperature which is lower than the melting point of the mixed powder.

12. An oxide superconductor comprising:
    a melt textured base material phase formed of a barium-containing oxide superconducting material;
    precipitation phases dispersed in said base material phase, said precipitation phases being present in an amount of from 1 to 50% by volume of said base material phase, and which are decomposition-products of a decomposition reaction of said superconducting material, and which are reaction-products of a reaction between said decomposition-products and oxides of one or more metals selected from the group consisting of silicon, aluminum, zirconium, magnesium, titanium, tungsten, cobalt and vanadium; and
    wherein said oxide superconductor has a critical current density "Jc" of at least 1000 A/cm$^2$ at a magnetic flux density of O T and a temperature of 77K.

13. The oxide superconductor according to claim 12, wherein said oxide superconducting material is selected from the group consisting of $LnBa_2Cu_3O_{7-\delta}$ wherein "Ln" stands for yttrium and lanthanides elements, $YBa_2Cu_4O_{10-\delta}$, $Tl_xBa_2Ca_yCu_zO_{w-\delta}$ ($1 \leq x \leq 2$, $0 \leq y < 3$, $1 \leq z \leq 4$, and $w = x+y+z+3$), $BaPb_{1-x}Bi_xO_3$ ($0 \leq x \leq 0.35$), and mixtures thereof.

14. The oxide superconductor according to claim 12, wherein said precipitation phases have grain sizes falling in a range of 0.01 to 100 micrometers.

* * * * *